(12) United States Patent
Shimizu

(10) Patent No.: US 8,138,424 B2
(45) Date of Patent: Mar. 20, 2012

(54) WIRING SUBSTRATE INCLUDING A REINFORCING STRUCTURAL BODY

(75) Inventor: Hiroshi Shimizu, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 752 days.

(21) Appl. No.: 12/211,458

(22) Filed: Sep. 16, 2008

(65) Prior Publication Data

US 2009/0145635 A1    Jun. 11, 2009

(30) Foreign Application Priority Data

Dec. 6, 2007    (JP) ................. 2007-315925

(51) Int. Cl.
*H05K 1/03*    (2006.01)
*H05K 1/11*    (2006.01)

(52) U.S. Cl. ............................. 174/255; 174/264

(58) Field of Classification Search .......... 361/748–803; 174/250–268; 29/846
See application file for complete search history.

(56) References Cited

U.S. PATENT DOCUMENTS

| | | | |
|---|---|---|---|
| 2007/0057363 A1 | 3/2007 | Nakamura | |
| 2007/0155057 A1* | 7/2007 | Wang | 438/122 |
| 2009/0141464 A1* | 6/2009 | Taguchi et al. | 361/760 |
| 2011/0005824 A1* | 1/2011 | An et al. | 174/261 |

FOREIGN PATENT DOCUMENTS

| | | |
|---|---|---|
| JP | 2007-73766 A1 | 3/2007 |
| WO | WO 2006/120826 | 11/2006 |

* cited by examiner

*Primary Examiner* — Zachary M Pape
(74) *Attorney, Agent, or Firm* — Kratz, Quintos & Hanson, LLP

(57) ABSTRACT

A wiring substrate includes (i) a wiring forming region in which wiring layers and an insulating layer are alternately stacked, (ii) an outer periphery region around the wiring forming region, and (iii) a reinforcing structural body having (a) a first reinforcing member continuously extending along said outer periphery region, and (b) a second reinforcing member extending in a thickness direction and being engaged with the first reinforcing member.

6 Claims, 10 Drawing Sheets

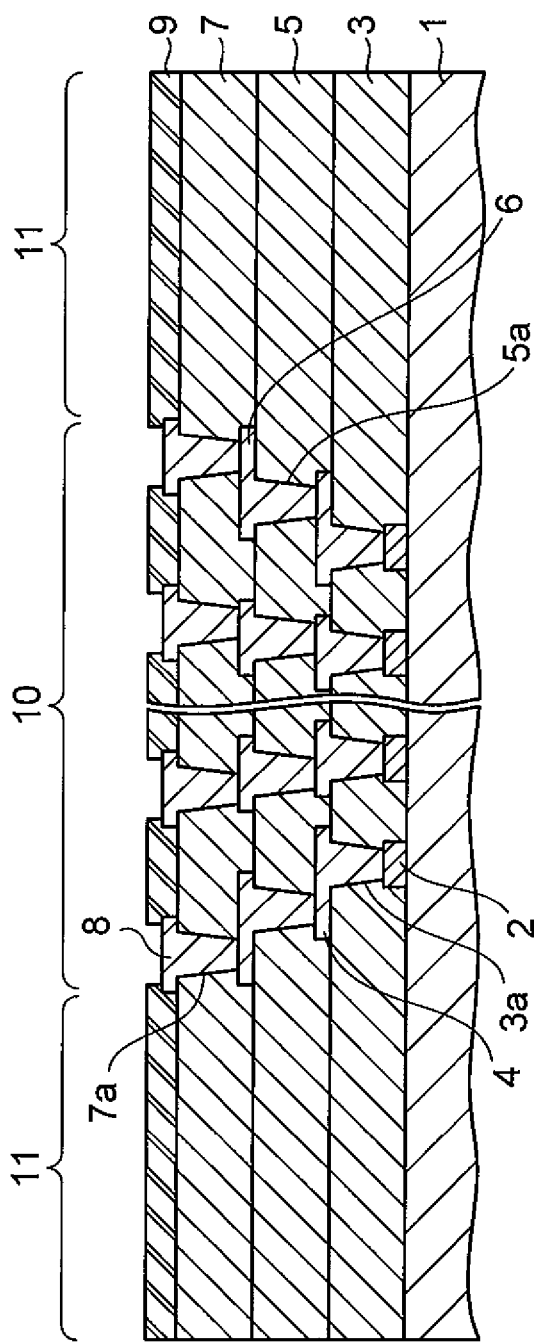
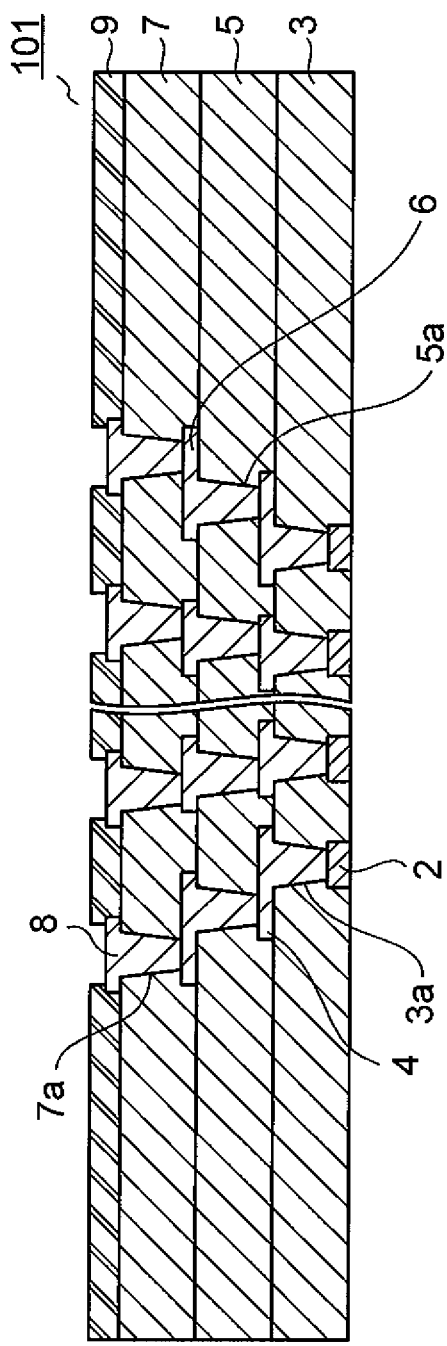
FIG. 1A (PRIOR ART)
FIG. 1B (PRIOR ART)

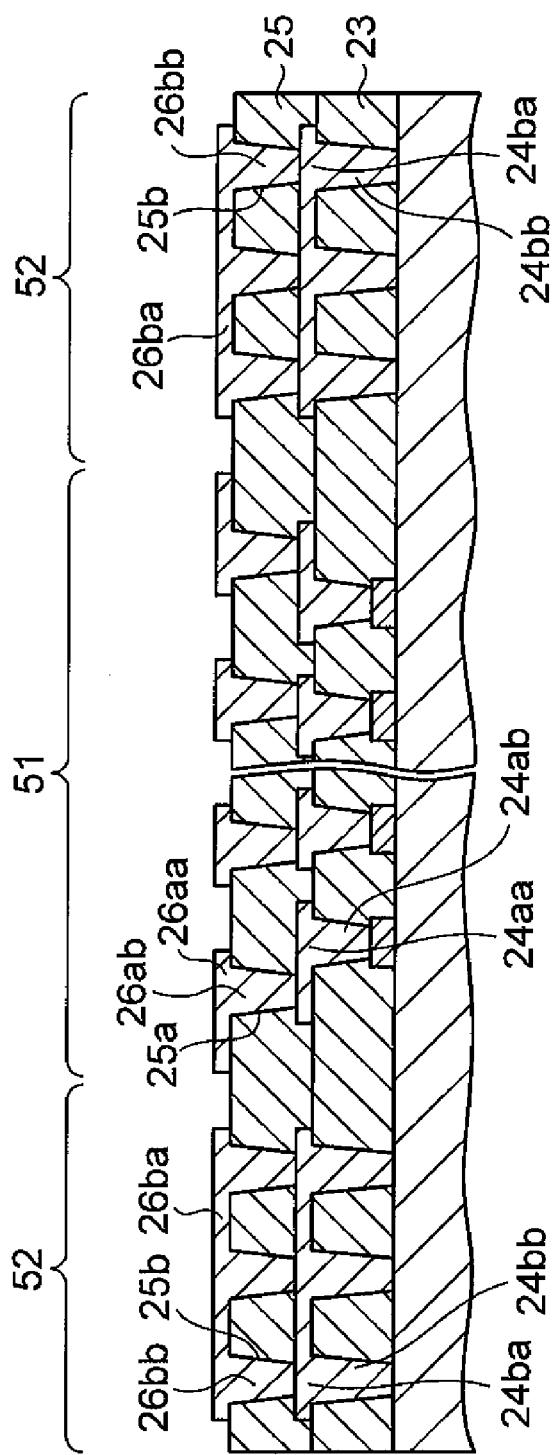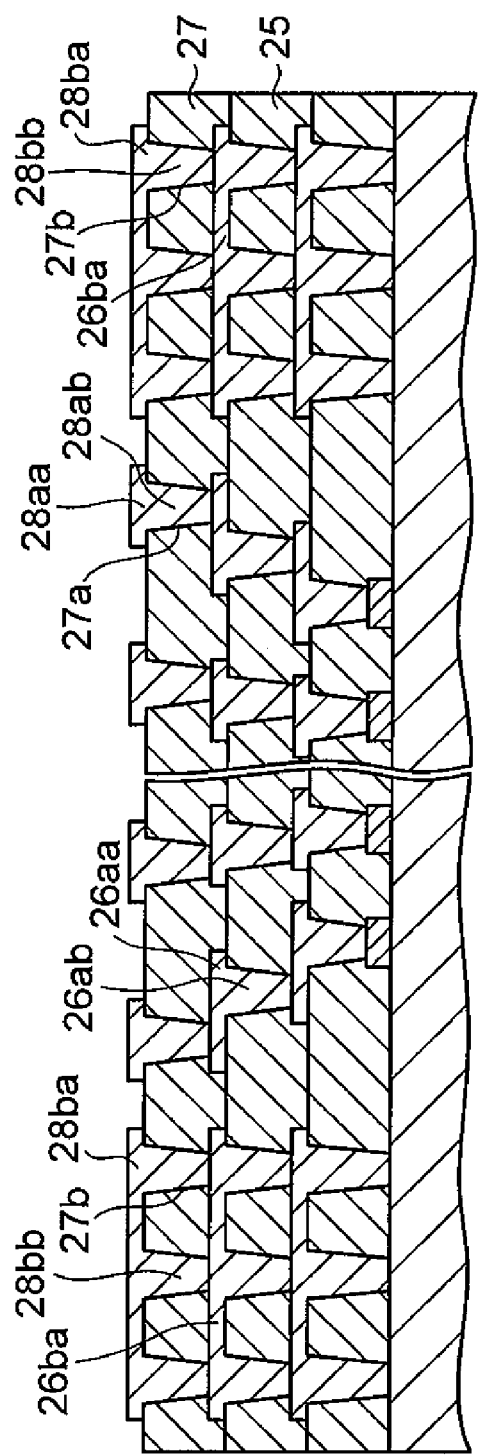
FIG. 4E
FIG. 4F

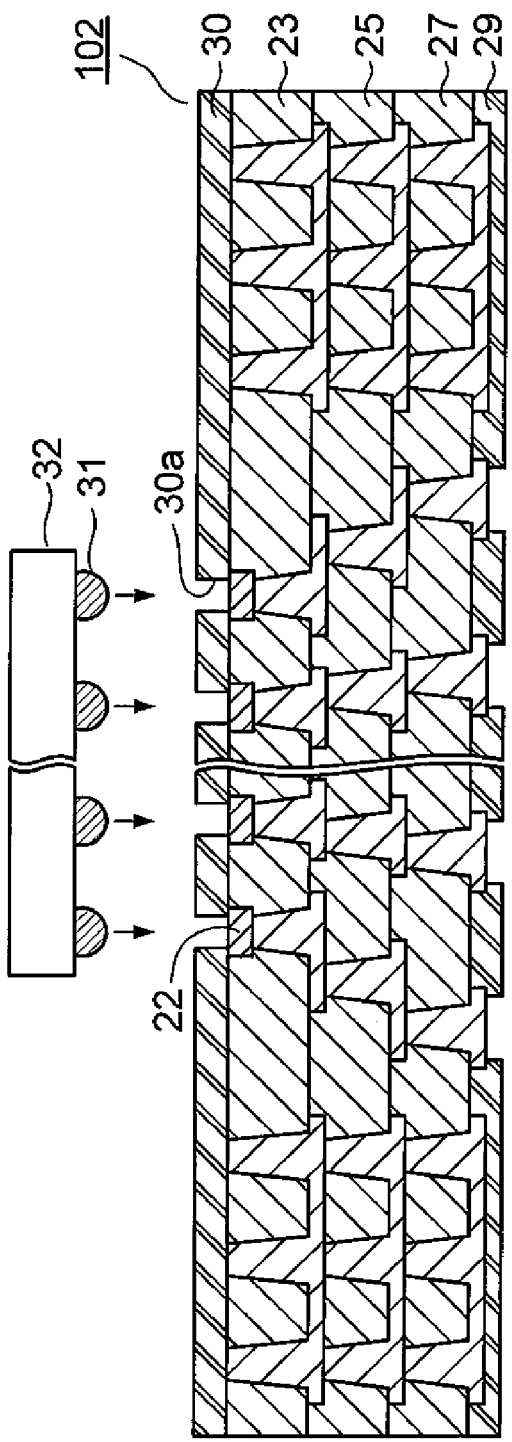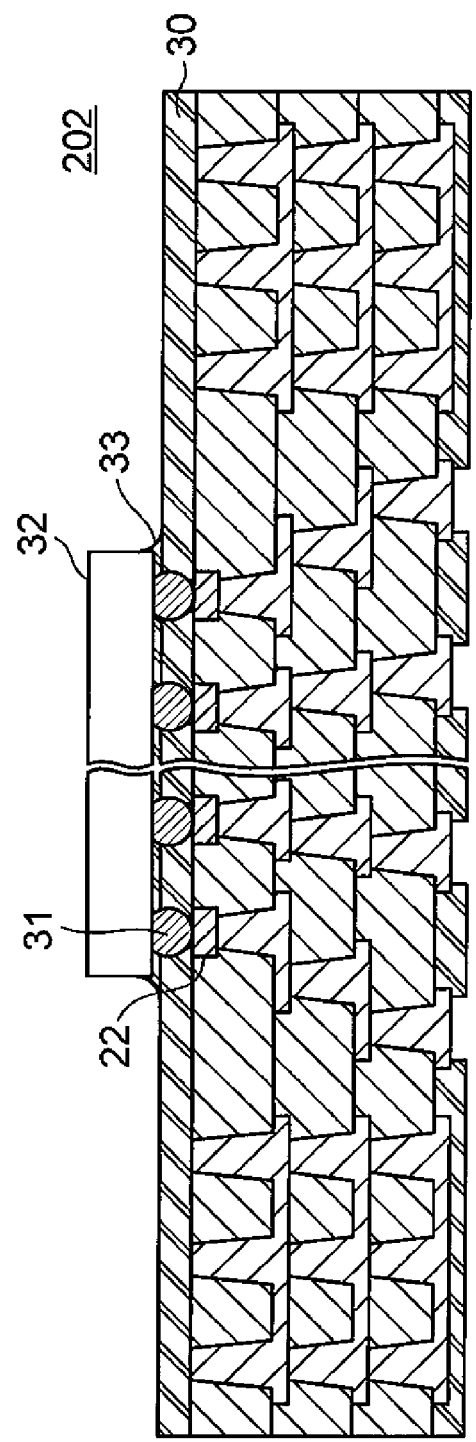
FIG. 7A
FIG. 7B

WIRING SUBSTRATE INCLUDING A REINFORCING STRUCTURAL BODY

CROSS-REFERENCE TO RELATED APPLICATIONS

This application is based on and claims priority of Japanese Patent Application No. 2007-315925 filed on Dec. 6, 2007, the entire contents of which are incorporated herein by reference.

BACKGROUND OF THE INVENTION (1) Field of the Invention

The present invention relates to a wiring substrate that is used for mounting electronic components such as an optical semiconductor device, a manufacturing method of the substrate, and an electronic component device.

(2) Description of the Related Art

Conventionally, a build-up method has been widely used as a technology of manufacturing a wiring substrate in a multilayer wiring structure. Many types of the wiring substrate formed by using the build-up method can be fabricated by combinations of a material of an interlayer insulating film (resin, representatively) and a via hole forming process. Its typical manufacturing process is performed by sequentially repeating formation of an insulating layer, a via hole in the insulating layer and a wiring layer including the inner part of the via hole to stack them on both surfaces or one surface of a core substrate as a supporting base material. In such a structure, a portion composed of wiring layers and insulating layers can be formed thin because they are stacked by the build-up method, but the core substrate requires a reasonable thickness in order to allow the wiring substrate to have rigidity. Thus, forming the entire wiring substrate (semiconductor package) thinner is limited.

For this reason, in order to make the wiring substrate even thinner, a structure in which a core substrate (supporting member) is removed recently has been employed. A wiring substrate of such a structure is also called a "coreless substrate" in a sense of having no "core" portion.

According to a basic process in a manufacturing method of such a coreless substrate, a temporary substrate 1 as a supporting body is prepared, a required number of build-up layers (insulating layers 3, 5, 7 including via holes 3a, 5a, 7a, and wiring layers 4, 6, 8 including the inner part of via holes 3a, 5a, 7a) are sequentially formed in a wiring forming region 10 of the temporary substrate 1 as shown in the cross-section of FIG. 1A, and then, the temporary substrate 1 is removed as shown in the cross-section of FIG. 1B. Note that reference numeral 2 in FIGS. 1A and 1B denotes a lower wiring layer, 9 denotes a solder resist film, 11 denotes an outer periphery region surrounding a wiring forming region 10, and reference numeral 101 in FIG. 1B denotes a coreless substrate (wiring substrate).

The coreless substrate 101 in use is inverted up and down at the time of mounting a chip 13 as shown in FIGS. 2A and 2B. Note that reference numeral 12 in FIGS. 2A and 2B denotes a bump. FIG. 3 shows a top view of the coreless substrate 101, and the coreless substrate 101 of FIGS. 2A and 2B corresponds to a cross-sectional view taken along line I-I of FIG. 3.

Related art is disclosed in Japanese Patent Laid-open No. 2007-73766.

As described above, since the conventional coreless substrate 101 has no core substrate, it is advantageous in the point of forming the substrate thinner, but on the contrary, it is disadvantageous in the point of easy occurrence of a "warp" in the coreless substrate 101 because of low rigidity of the entire coreless substrate 101.

This appears more conspicuously when the chip 13 is mounted as shown in FIGS. 2A and 2B. Specifically, after performing heating and cooling processes in mounting the chip 13, as shown in the dotted line of FIG. 2B, a "warp" is caused to occur by a thermal expansion coefficient difference between the chip 13 and the coreless substrate 101. Furthermore, the "warp" is promoted by a thermal expansion coefficient difference between underfill resin 14, which is filled in a gap between the coreless substrate 101 and the chip 13, and the coreless substrate 101. For this reason, there are cases where the mounted chip is often cracked or peeled, and it causes a problem that reliability of chip mounting drastically reduces.

Further, the warp of substrate does not necessarily occur only when mounting a chip, but also it could occur on the stage before mounting a chip. For example, in the case where coreless substrates are shipped to customer's premises and chips are mounted in the customer's premises, the warp could occur in the substrate depending on handling from shipping to mounting because the rigidity of the coreless substrates is originally low and flexible.

SUMMARY OF THE INVENTION

It is an object of the invention to provide a wiring substrate which is capable of reducing "warp" caused in the wiring substrate by a thermal expansion coefficient difference, and of performing highly reliable mounting, a manufacturing method thereof, and an electronic component device.

Meanwhile, to a problem of "warp" occuring in the wiring substrate by a thermal expansion coefficient difference between insulating layers made of resin and wiring layers made of metal, Japanese Patent Laid-open No. 2007-73766 discloses a solving method. In contrast, by a new constitution different from the solving method, the present invention according to the wiring substrate, the manufacturing method thereof and the electronic component device solves the problem of "warp" occurring in the wiring substrate.

To solve the above-described problem, the present invention relates to a wiring substrate that has: (i) a wiring forming region in which wiring layers and an insulating layer are alternately stacked; (ii) an outer periphery region around the wiring forming region; and (iii) a reinforcing structural body having (a) a first reinforcing member continuously extending along the outer periphery region, and (b) a second reinforcing member extending in a thickness direction and being engaged with the first reinforcing member.

Since the first reinforcing member continuously extends along the outer periphery region, it can reduce a warp that occurs along four sides when a square wiring substrate is used, for example. Furthermore, in addition to the first reinforcing member continuously extending along the outer periphery region, the wiring substrate has the second reinforcing member extending in the thickness direction and being engaged with the first reinforcing member, so that they are combined to form a solid reinforcing structural body. Thus, it is possible to increase the rigidity of the wiring and further enhance the above-described effect.

Preferably, the first reinforcing member is composed of reinforcing patterns that form a multilayer structure and continuously extend within planes of respective layers, and the second reinforcing member is composed of reinforcing pillars that are buried in the insulating layer sandwiched between reinforcing patterns of different layers.

Further, preferably, by arranging a plurality of the reinforcing patterns so as to be parallel with each other within the same layer, or by arranging a plurality of the reinforcing patterns so as to form a grating within the same layer, rigidity can be further increased.

Further, to solve the above-described problem, the present invention relates to a manufacturing method of a wiring substrate, and has: a process of preparing a temporary substrate on which a wiring forming region and an outer periphery region surrounding the wiring forming region are arranged; a process of forming a first wiring layer in the wiring forming region on the temporary substrate and forming a first reinforcing pattern continuously extending along the outer periphery region; a process of forming a first insulating layer on the first wiring layer and the first reinforcing pattern; a process of forming a via hole in the first insulating layer on the first wiring layer and forming opening portions in the first insulating layer on the first reinforcing pattern; a process of forming a via in the via hole of the wiring forming region and forming reinforcing pillars having the same material as the via in the opening portions of the outer periphery region; a process of forming a second wiring layer connecting to the via of the wiring forming region on the first insulating layer and forming a second reinforcing pattern, which continuously extends in the outer periphery region and connects to the reinforcing pillar, on the first insulating layer; and a process of removing the temporary substrate.

Thus, when forming a wiring layer of the wiring forming region, the reinforcing pattern can be formed on the same layer as the wiring layer by the same process in the outer periphery region around the wiring forming region, and furthermore, when forming vias of the wiring forming region, reinforcing pillars can be formed in the outer periphery region around the wiring forming region by the same process. For this reason, without changing the process, it is possible to easily manufacture the wiring substrate capable of reducing occurrence of a warp caused by a thermal expansion coefficient difference.

Preferably, by forming the first reinforcing pattern in the same material, the same thickness and the same width as the first wiring layer in the process of forming the first reinforcing pattern, and by forming the second reinforcing pattern in the same material, the same thickness and the same width as the second wiring layer in the process of forming the second reinforcing pattern, manufacturing conditions may not be significantly changed, and thus fabrication of the wiring substrate becomes easier.

Further, to solve the above-described problem, the present invention relates to an electronic component device, and it has the wiring substrate of the above-described structure and electronic components connected to the wiring layer being an outermost layer of the wiring substrate.

Since the wiring substrate according to the present invention is used, even in the case of filling thermosetting resin as the underfill resin in a gap between the wiring substrate and the electronic components, the occurrence of warp resulted from a thermal expansion coefficient difference can be reduced.

BRIEF DESCRIPTION OF THE DRAWINGS

FIGS. 1A and 1B are cross-sectional views for describing a wiring substrate of prior art and a manufacturing method thereof.

FIGS. 4A to 4H are cross-sectional views showing the manufacturing method of the wiring substrate according to the first embodiment of the present invention.

FIGS. 7A and 7B are cross-sectional views showing the manufacturing method of an electronic component device using the wiring substrate according to the first embodiment of the present invention.

DESCRIPTION OF THE PREFERRED EMBODIMENTS

In the following, description will be made for embodiments of the present invention by referring to the attached drawings.

First Embodiment (Wiring Substrate)

Figure 5:
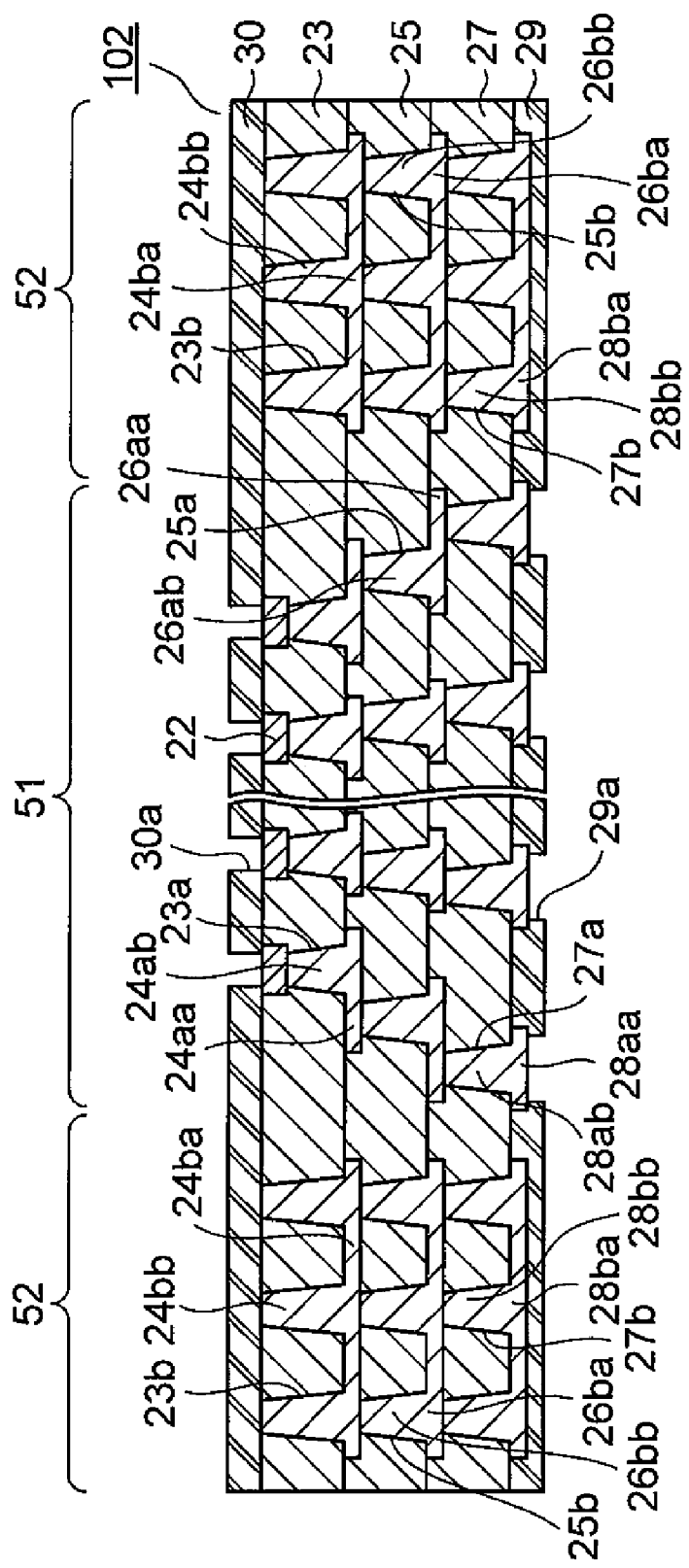
FIG. 5 is a cross-sectional view showing the constitution of the wiring substrate according to the first embodiment of the present invention.
Figure 6:
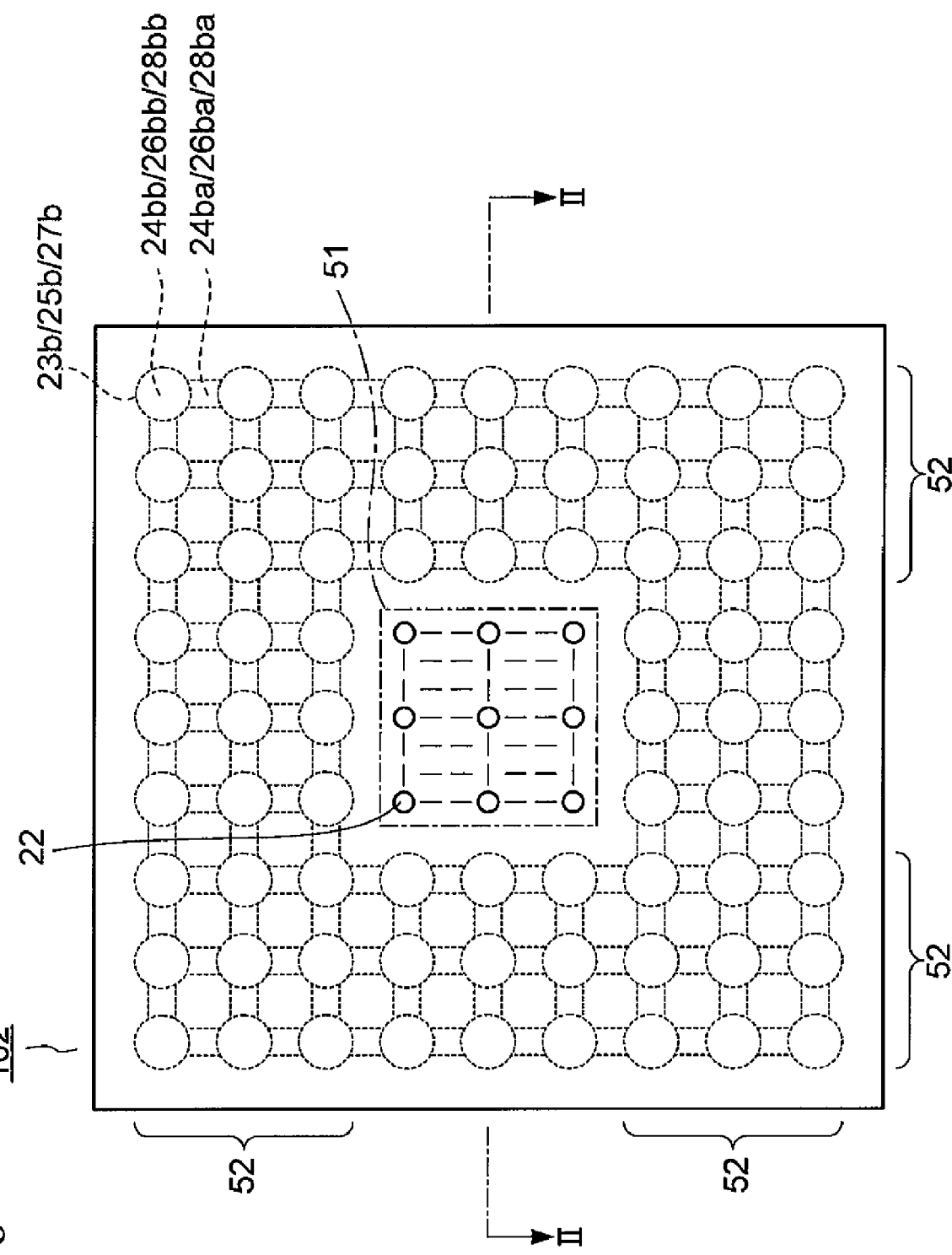
FIG. 6 is a top view of the wiring substrate of FIG. 5.

FIG. 5 is the cross-sectional view showing the wiring substrate of a first embodiment, and FIG. 6 is the top view of the wiring substrate of FIG. 5. FIG. 5 corresponds to the cross-sectional view taken along line II-II of FIG. 6.

A wiring substrate 102 is in a square flat shape, as shown in FIG. 6, and has a wiring forming region 51 at a central portion and an outer periphery region 52 arranged so as to surround the wiring forming region 51.

In the wiring forming region 51, four layers of build-up wiring layers and vias that connect wiring layers of adjacent layers to each other are formed.

The four layers of build-up wiring layers in the wiring forming region 51, as shown in FIG. 5, are constituted of a first wiring layer 22, a second wiring layer 24aa, a third wiring layer 26aa and a fourth wiring layer 28aa, and these wiring layers are formed so as to sandwich a first insulating layer 23, a second insulating layer 25 and a third insulating layer 27 between the layers.

A first via 24ab is buried in a first via hole 23a formed in the first insulating layer 23 to connect the first wiring layer 22 to the second wiring layer 24aa. Further, a second via 26ab is buried in a second via hole 25a formed in the second insulating layer 25 to connect the second wiring layer 24aa to the third wiring layer 26aa. Further, a third via 28ab is buried in a third via hole 27a formed in the third insulating layer 27 to connect the third wiring layer 26aa to the fourth wiring layer 28aa.

Epoxy resin, polyimide resin, photosensitive resin or the like is used for the first to third insulating layers 23, 25, 27. Further, copper is used for each material of the second to fourth wiring layers 24aa, 26aa, 28aa and the first to third vias 24ab, 26ab, 28ab. The first wiring layer 22 is constituted of a two-layer structure of nickel (Ni) film and gold (Au) film from a lower layer. Further, in the fourth wiring layer 28aa, the copper surface is subject to formation of a contact layer (not shown) made up of two layers of nickel (Ni) film and gold (Au) film from a lower layer. Such a two-layer structure is used because the first wiring layer 22 and the fourth wiring layer 28aa become internal and external connection pads. The nickel (Ni) film is interposed for improving adhesiveness between the gold (Au) film and copper, and the gold (Au) film is used for securing wettability of solder or the like or for enhancing adhesiveness with bonding wire.

In the outer periphery region 52, a reinforcing structural body is formed. The reinforcing structural body is constituted of reinforcing patterns of a three-layer structure and reinforcing pillars of the same three-layer structure.

The reinforcing patterns of a three-layer structure (first reinforcing member) are constituted of a first reinforcing pattern 24ba, a second reinforcing pattern 26ba and a third reinforcing pattern 28ba as shown in FIG. 5. The reinforcing patterns are formed so as to sandwich the first insulating layer 23, the second insulating layer 25 and the third insulating layer 27 between the layers. The first to third reinforcing patterns 24ba, 26ba, 28ba are formed in the same layer as the second to fourth wiring layers 24aa, 26aa, 28aa, respectively, and by the same material, the same thickness and the same width as the second to fourth wiring layers 24aa, 26aa, 28aa, respectively.

The reinforcing pillars of a three-layer structure (second reinforcing member) are constituted of a first reinforcing pillar 24bb, a second reinforcing pillar 26bb and a third reinforcing pillar 28bb as shown in FIG. 5. The reinforcing pillars are buried in first to third opening portions 23b, 25b, 27b formed in the first insulating layer 23, the second insulating layer 25 and the third insulating layer 27, respectively. The first to third reinforcing pillars 24bb, 26bb, 28bb are formed of the same material as the first to third vias 24ab, 26ab, 28ab, respectively.

In the upper layer out of the three-layer structure, the first reinforcing patterns 24ba are provided as shown in FIG. 5 and FIG. 6. The first reinforcing patterns 24ba continuously extend in a direction along each side of the wiring substrate 102 and by three rows per each side. Further, other first reinforcing patterns 24ba continuously extending in a direction orthogonal to the reinforcing patterns 24ba extending in a direction along each side are arranged to form a grating state. Further, the first reinforcing pillars 24bb are provided in crossing areas of the patterns as shown in FIG. 6. In the case of FIG. 6, nine of the first reinforcing pillar 24bb are provided per the reinforcing pattern 24ba continuously extending along each side.

In the middle layer, the second reinforcing pillar 26bb is provided in an arrangement overlapped with the first reinforcing pillar 24bb seen from above and in contact with the first reinforcing pattern 24ba, and the second reinforcing pattern 26ba is provided in an arrangement overlapped with the first reinforcing pattern 24ba seen from above in the same manner and in contact with the second reinforcing pillar 26bb.

In the lower layer, the third reinforcing pillar 28bb is provided in an arrangement overlapped with the first reinforcing pillar 24bb and the second reinforcing pillar 26bb seen from above and in contact with the second reinforcing pattern 26ba, and the third reinforcing pattern 28ba is provided in an arrangement overlapped with the first reinforcing pattern 24ba and the second reinforcing pattern 26ba seen from above in the same manner and in contact with the third reinforcing pillar 28bb.

As described above, the reinforcing structural body has a solid structure in which cubes or rectangular parallelepipeds are arranged in three rows and built-up in three layers, the cubes or rectangular parallelepipeds are combined with each other while leaving only frameworks. Note that the reinforcing patterns 24ba, 26ba, 28ba or the like may be used for reinforcing and may also serve as power source wiring or grounding wiring.

Further, solder resist films 30, 29 are formed on the upper surface and the lower surface of the wiring substrate 102 to protect the wiring layers and the reinforcing patterns. Contact holes 30a for connecting electronic components such as a semiconductor chip to the first wiring layer 22 are formed in the solder resist film 30 of the upper surface. In the same manner, contact holes 29a for connecting another wiring substrate to the fourth wiring layer 28aa are formed in the solder resist film 29 of the lower surface.

As described above, according to the wiring substrate 102 of the first embodiment, in the outer periphery region 52 along each side of the square wiring substrate 102, the first to third reinforcing patterns 24ba, 26ba, 28ba continuously extend in a direction along the side. Accordingly, it is possible to increase rigidity against the warp that occurs along the side, and thus, it is possible to reduce the warp that occurs along the side.

Further, since the first to third reinforcing patterns 24ba, 26ba, 28ba and the first to third reinforcing pillars 24bb, 26bb, 28bb are allowed to bond organically to form the solid (three-dimensional) reinforcing structural body, rigidity can be further increased, and thus, the warp can be further reduced.

(Electronic Component Device)

Next, description will be made for an electronic component device using the above-described wiring substrate 102 referring to FIG. 7B. FIG. 7B is the cross-sectional view showing an electronic component device using the above-described wiring substrate 102.

In the electronic component device, a semiconductor chip (electronic component) 32 is connected to the first wiring layer 22 being a top layer (an outermost layer) of the wiring substrate 102 by bumps 31 via the contact holes 30a. Underfill resin 33 is filled between the wiring substrate 102 and the semiconductor chip 32. The underfill resin 33 is made of thermosetting resin such as epoxy resin.

Although the semiconductor chip 32 is exemplified as an electronic component, various electronic components such as a capacitor component can be mounted. Further, the first wiring layer 22 side of the wiring substrate 102 is used as a mounting surface of electronic components, but the fourth wiring layer 28aa side may be used as a mounting surface of electronic components.

As described above, according to electronic component device using the wiring substrate 102 of the first embodiment, since the above-described wiring substrate 102 is used, it is possible to reduce the occurrence of warp resulted from a thermal expansion coefficient difference even in the case where thermosetting resin as the underfill resin 33 is filled in a gap between the wiring substrate 102 and the semiconductor chip 32.

(Manufacturing Method of Wiring Substrate)

FIG. 4 to FIG. 5 are the cross-sectional views showing the manufacturing method of the wiring substrate according to the first embodiment.

Figure 2A:
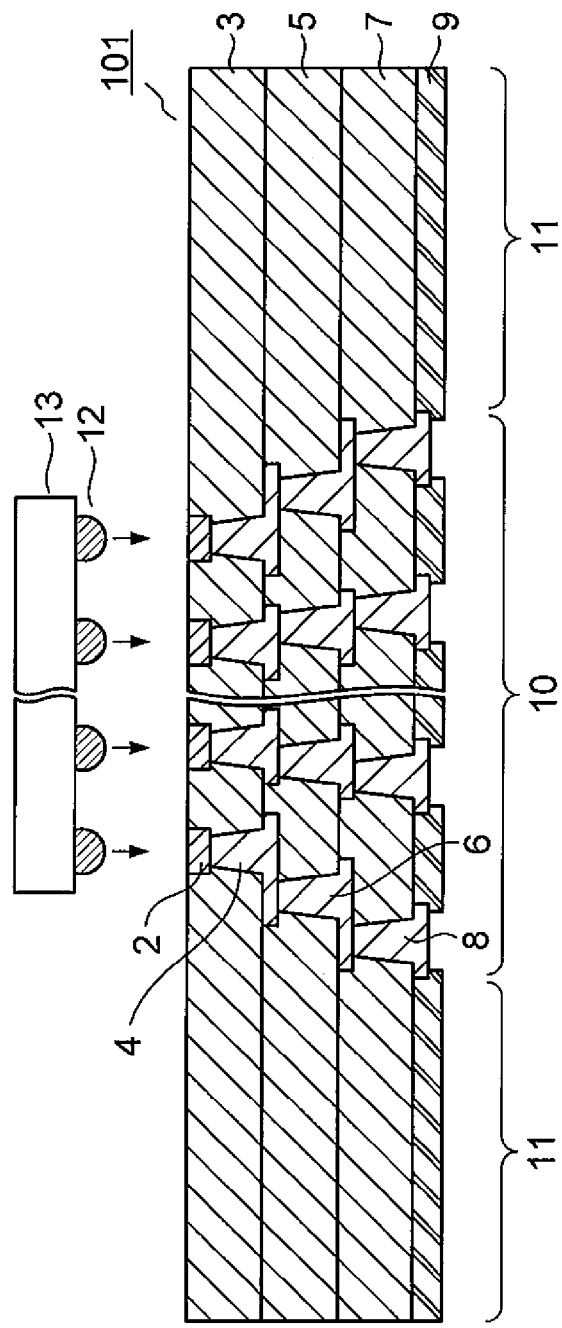
FIGS. 2A and 2B are cross-sectional views for describing an electronic component device of prior art and a manufacturing method thereof.
Figure 2B:
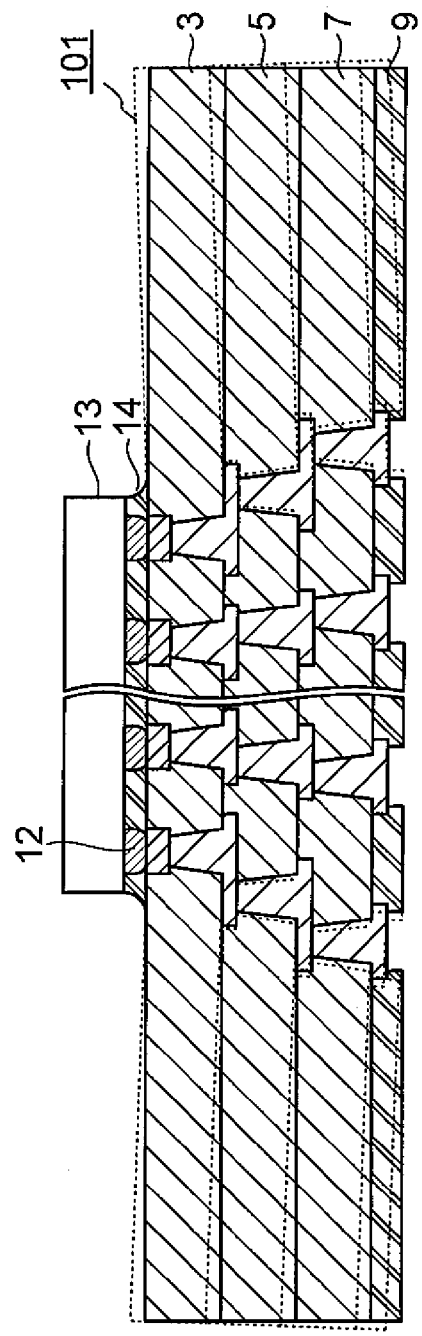
Figure 3:
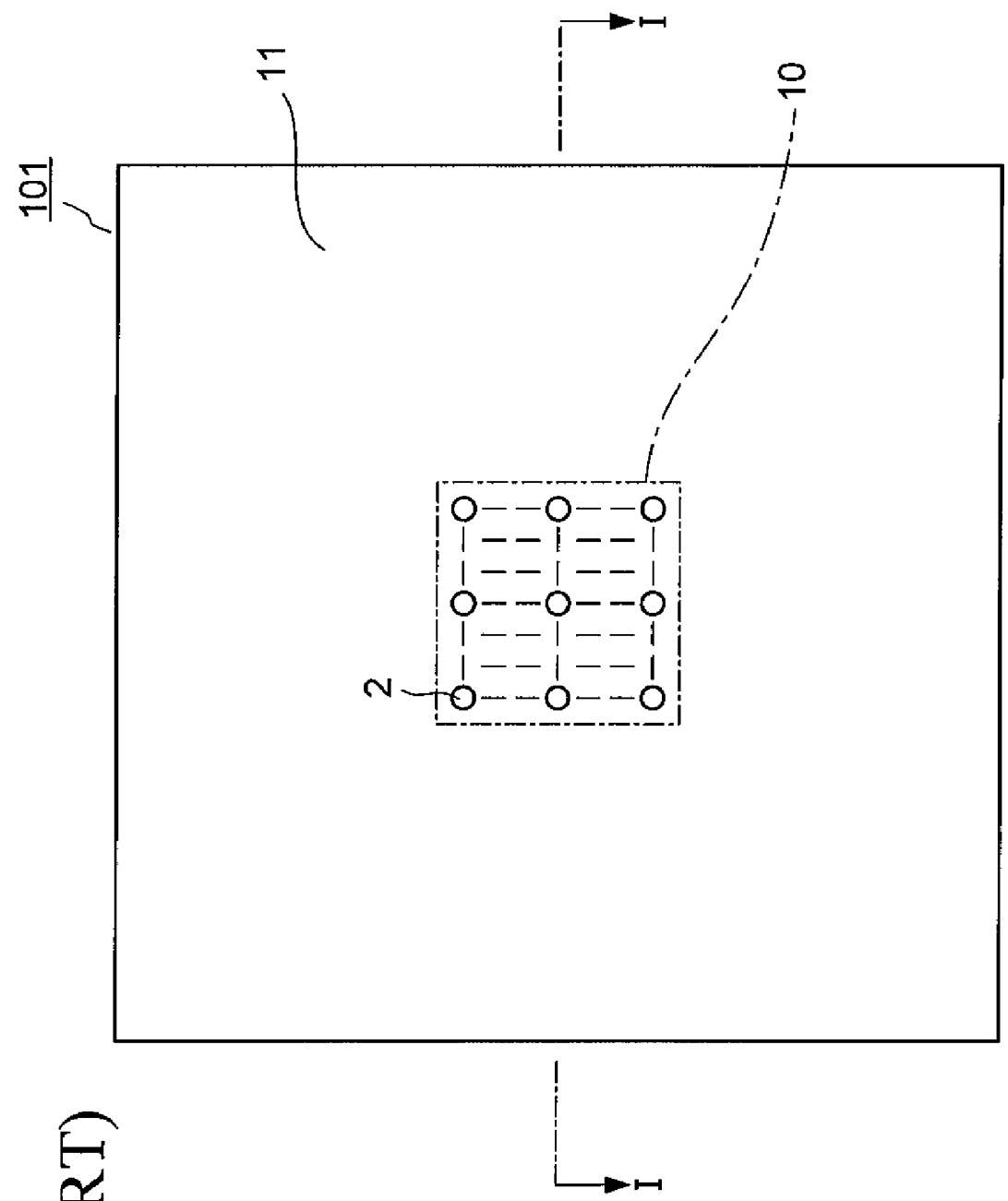
FIG. 3 is a top view of the wiring substrate of FIG. 1B.
Figure 4A:
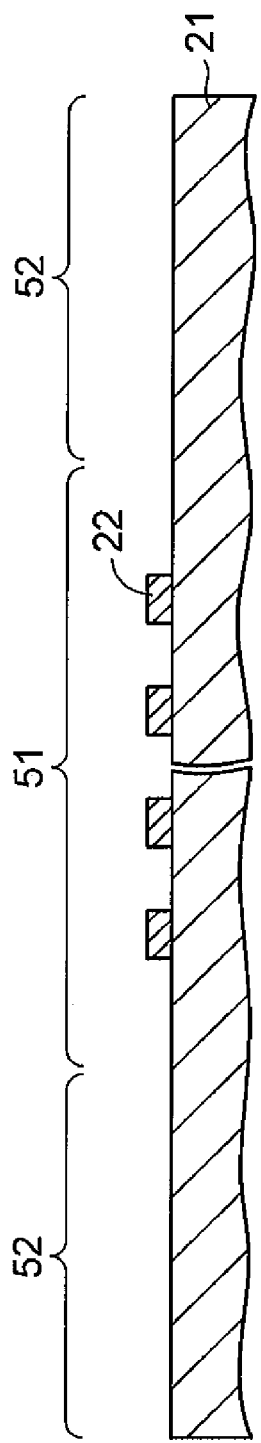

First, as shown in FIG. 4A, a temporary substrate 21 is prepared. In the temporary substrate 21, the wiring forming region 51, in which four layers of build-up wiring layers are formed, is defined in a central portion, and the outer periphery region 52, in which the reinforcing structural body is formed, is defined so as to surround the wiring forming region 51. The wiring forming region 51 may be zoned on one side of the temporary substrate 21 by one or plural numbers, or may be zoned on both sides by one or plural numbers.

A preferable material of the temporary substrate 21 is a thin copper plate, but not limited to this. It should only be a material capable of being selectively etched to a material of internal and external connection pads of a bottom layer (an outermost layer) and a top layer (an outermost layer) of the build-up wiring substrate.

Next, a plating resist film (not shown), in which opening portions are provided at predetermined portions, is formed on the temporary substrate 21, followed by forming gold (Au) film and nickel (Ni) film from the lower layer by electrolytic plating in the opening portions of plating resist film, and then forming the first wiring layer (third wiring layer in claim 8) 22 of a two-layer structure. After that, the plating resist film is removed.

Figure 4B:
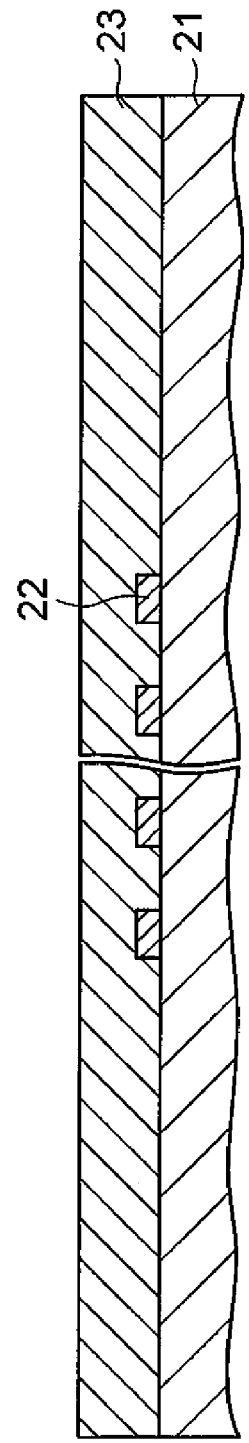

Next, as shown in FIG. 4B, the temporary substrate 21 is subject thereon to formation of the first insulating layer (second insulating layer in claim 8) 23 coating the first wiring layer 22. The material of the first insulating layer 23 in use is epoxy resin, polyimide resin or the like. The first insulating layer 23 is obtained by the forming method of the first insulating layer 23, such that resin film is laminated on the temporary substrate 21, followed by thermally processing and curing the resin film at the temperature of 130 to 150° C. while pressing (press) the film, for example.

Figure 4C:
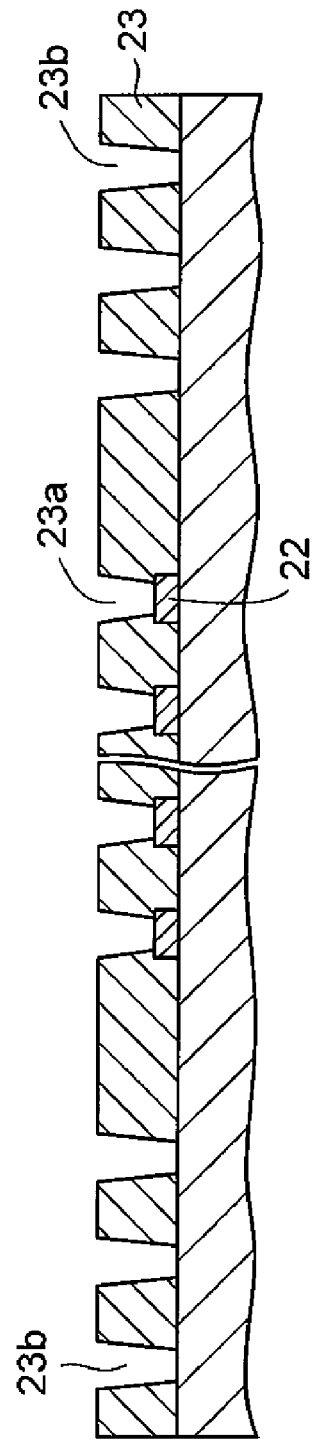

Next, as shown in FIG. 4C, the first insulating layer 23 is processed by laser or the like so as to expose the first wiring layer 22 of the temporary substrate 21. Thus, the first via holes 23a reaching the first wiring layer 22 are formed in the wiring forming region 51. Further, the first opening portions 23b, which reaches the temporary substrate 21 and is buried with reinforcing pillars, are formed by a required number (six in total on both sides facing to each other in the example shown in the drawing) and with an appropriate interval in the outer periphery region 52.

Note that the first insulating layer 23 having the first via holes 23a and the first opening portions 23b may be formed by patterning photosensitive resin film by using photolithography, or may be formed by screen-printing resin film having opening portions.

Figure 4D:
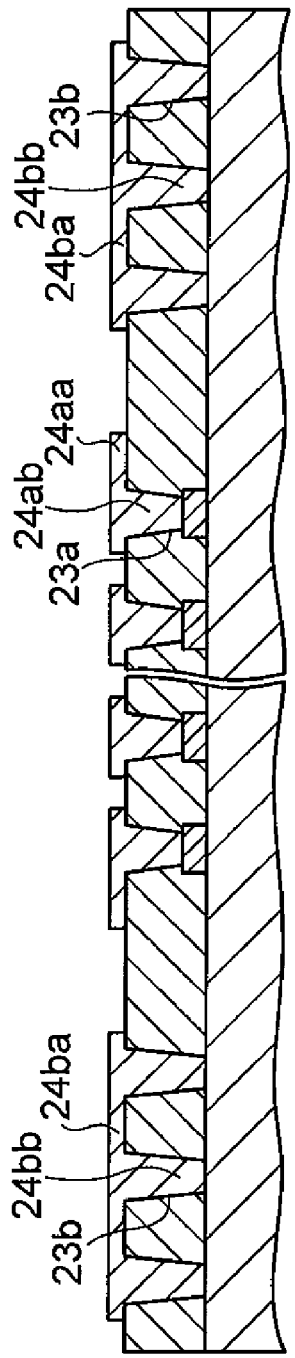

Next, as shown in FIG. 4D, the wiring forming region 51 is subject to formation of the first via 24ab made of copper (Cu) or the like inside the first via holes 23a to connect with the first wiring layer 22, and continuously to formation of the second wiring layer (first wiring layer in claim 6) 24aa on the first insulating layer 23 to connect with the first via. In the same process, the outer periphery region 52 is subject to formation of the first reinforcing pillars 24bb inside the first opening portion 23b, and continuously to formation of the first reinforcing pattern 24ba on the first insulating layer 23 to contact the first reinforcing pillars 24bb. A semi-additive method, for example is used for formation of the first vias 24ab, the second wiring layer 24aa, the first reinforcing pillars 24bb and the first reinforcing pattern 24ba.

Description will be made in detail for the semi-additive method. First, a Cu seed layer (not shown) is formed inside the first via holes 23a, inside the first opening portions 23b and on the first insulating layer 23 by an electroless plating method or a sputtering method, followed by forming resist film (not shown) having opening portions corresponding to the first vias 24ab, the second wiring layer 24aa, the first reinforcing pillars 24bb and the first reinforcing pattern 24ba. At this time, it is preferable to form the first reinforcing pillars 24bb and the first reinforcing pattern 24ba with the same thickness and the same width as the first vias 24ab and the second wiring layer 24aa in the copper plating method that is carried out through opening portions of the resist film. Because according to such manner, an applied way of copper plating to the Cu seed layer does not become uneven.

Subsequently, a Cu layer pattern (not shown) is formed on the opening portions of the resist film by an electrolytic plating method utilizing the Cu seed layer as a plating feed layer.

Next, after removing the resist film, the Cu seed layer is etched by using the Cu layer pattern as a mask to obtain the first via 24ab, the second wiring layer 24aa, the first reinforcing pillar 24bb and the first reinforcing pattern 24ba. As an applicable forming methods thereof, there are various wiring forming methods such as a subtractive method in addition to the above-described semi-additive method.

Next, by repeating a similar process as FIGS. 4B to 4D, as shown in FIG. 4E, in the wiring forming region 51, the second vias 26ab and the third wiring layer (second wiring layer in claim 6) 26aa to connect with the second wiring layer 24aa via the second vias 26ab are formed inside the second via holes 25a of the second insulating layer (first insulating layer in claim 6) 25 and on the second insulating layer 25, respectively. And in the outer periphery region 52, the second reinforcing pillars 26bb and the second reinforcing pattern 26ba, which have the same material, the same thickness and the same width as the second via 26ab and the third wiring layer 26aa respectively, are formed inside the second opening portion 25b and on the second insulating layer 25, respectively.

Next, by repeating a similar process as FIGS. 4B to 4D, as shown in FIG. 4F, in the wiring forming region 51, the third vias 28ab and the fourth wiring layer 28aa to connect with the third wiring layer 26aa via the third vias 28ab are formed inside the third via holes 27a of the third insulating layer 27 and on the third insulating layer 27, respectively. And in the outer periphery region 52, the third reinforcing pillars 28bb and the third reinforcing pattern 28ba, which have the same material, the same thickness and the same width as the third vias 28ab and the fourth wiring layer 28aa, respectively, are formed inside the third opening portions 27b and on the third insulating layer 27, respectively.

Figure 4G:
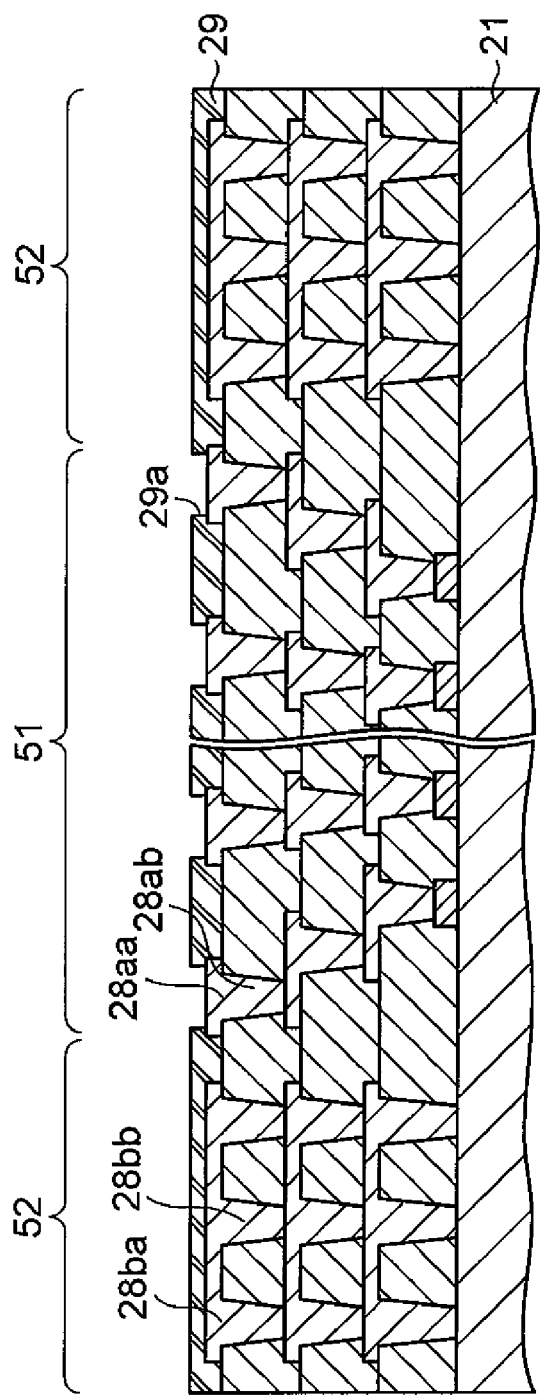
Figure 4H:
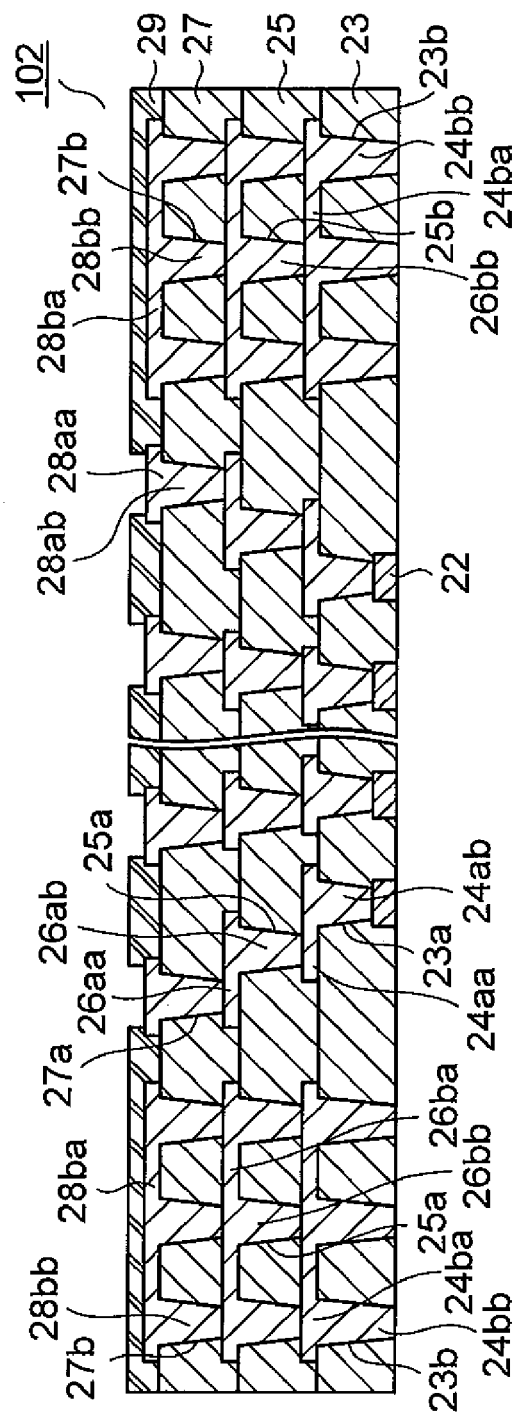

Next, as shown in FIG. 4G, a solder resist film 29 is formed. The solder resist film 29 are provided with opening portions (contact holes) 29a on the fourth wiring layer 28aa. Thus, the exposed portions of the fourth wiring layer 28aa inside the opening portions 29a of the solder resist film 29 become external connection pads to connect with another wiring substrate or the like. Subsequently, a contact layer (not shown) such as an Ni/Au plated layer is formed on the fourth wiring layer 28aa inside the opening portion 29a of the solder resist film 29. Consequently, four layers of the build-up wiring layers (first to fourth wiring layers 22, 24aa, 26aa, 28aa) are completed on the temporary substrate 21. Although the four layers of the build-up wiring layers is formed in the above-described example, n-layers (n is an integer of 2, 3, or 5 or more) of build-up wiring layers may be formed.

Next, the temporary substrate 21 is removed by selective etching. In this case, it is gold (Au) that is exposed outside the first wiring layer 22 and the fourth wiring layer 28aa of the build-up wiring layers. Therefore, it is capable of selectively etching the temporary substrate 21 made of copper (Cu) to gold (Au).

Next, as shown in FIG. 5, top and bottom are inverted to make the first wiring layer 22 position on the top, and the surface thereof is subject to formation of the solder resist film 30 where the opening portions 30a are provided. Thus, the exposed portions of the first wiring layer 22 inside the opening portions 30a of the solder resist film 30 become internal connection pads to connect with electronic components. Although the top and bottom of the wiring substrate 102 are inverted to make the first wiring layer 22 side be a mounting surface of the electronic component, the fourth wiring layer 28*aa* side may serve as the mounting surface of the electronic component without inverting the top and bottom.

Consequently, the careless wiring substrate 102 is completed.

As described above, according to the manufacturing method of the wiring substrate of the first embodiment, when the second to fourth wiring layers 24*aa*, 26*aa*, 28*aa* are formed in the wiring forming region 51, the first to third reinforcing patterns 24*ba*, 26*ba*, 28*ba* are formed in the outer periphery region 52 of the wiring forming region 51 by the same process and on the same layers as the second to fourth wiring layers 24*aa*, 26*aa*, 28*aa*, respectively, and by the same material, the same thickness and the same width as the second to fourth wiring layers 24*aa*, 26*aa*, 28*aa*, respectively. Further, when the first to third vias 24*ab*, 26*ab*, 28*ab* are formed in the wiring forming region 51, the first to third reinforcing pillars 24*bb*, 26*bb*, 28*bb* can be formed in the outer periphery region 52 around the wiring forming region 51 by the same process, respectively. Accordingly, it is possible to easily manufacture the wiring substrate 102 capable of reducing the occurrence of warp resulted from a thermal expansion coefficient difference without significantly changing a process or manufacturing conditions.

(Manufacturing Method of Electronic Component Device)

Next, description will be made for the manufacturing method of an electronic component device using the above-described wiring substrate referring to FIGS. 7A and 7B. FIGS. 7A and 7B are the cross-sectional views showing the manufacturing method of an electronic component device using the above-described wiring substrate 102.

In the manufacturing method of an electronic component device, a semiconductor chip (electronic component device) 32, which is equipped with the wiring substrate 102 of FIG. 5 and the bumps 31, is prepared first.

Next, the bumps 31 of the semiconductor chip 32 are connected to the first wiring layer 22 (the top layer) of the wiring substrate 102 by flip chip bonding.

Next, thermosetting resin 33 made of liquid state epoxy resin or the like is allowed to flow into and fill in the gap between the wiring substrate 102 and the semiconductor chip 32. Once the resin is sufficiently filled, the resin 33 is cured by heating, and is then cooled down. Thus, the underfill resin 33 is formed and the electronic component device is completed.

Regarding the applicable mounting method of electronic components, there may be various mounting methods such as a wire bonding method other than the flip chip mounting.

According to the manufacturing method of an electronic component device using the wiring substrate 102 of the first embodiment, the above-described wiring substrate 102 is used, so that it is possible to reduce the occurrence of warp resulted from a thermal expansion coefficient difference even in the case of filling thermosetting resin as the underfill resin 33 between the wiring substrate 102 and the semiconductor chip 32.

Second Embodiment

Figure 8:
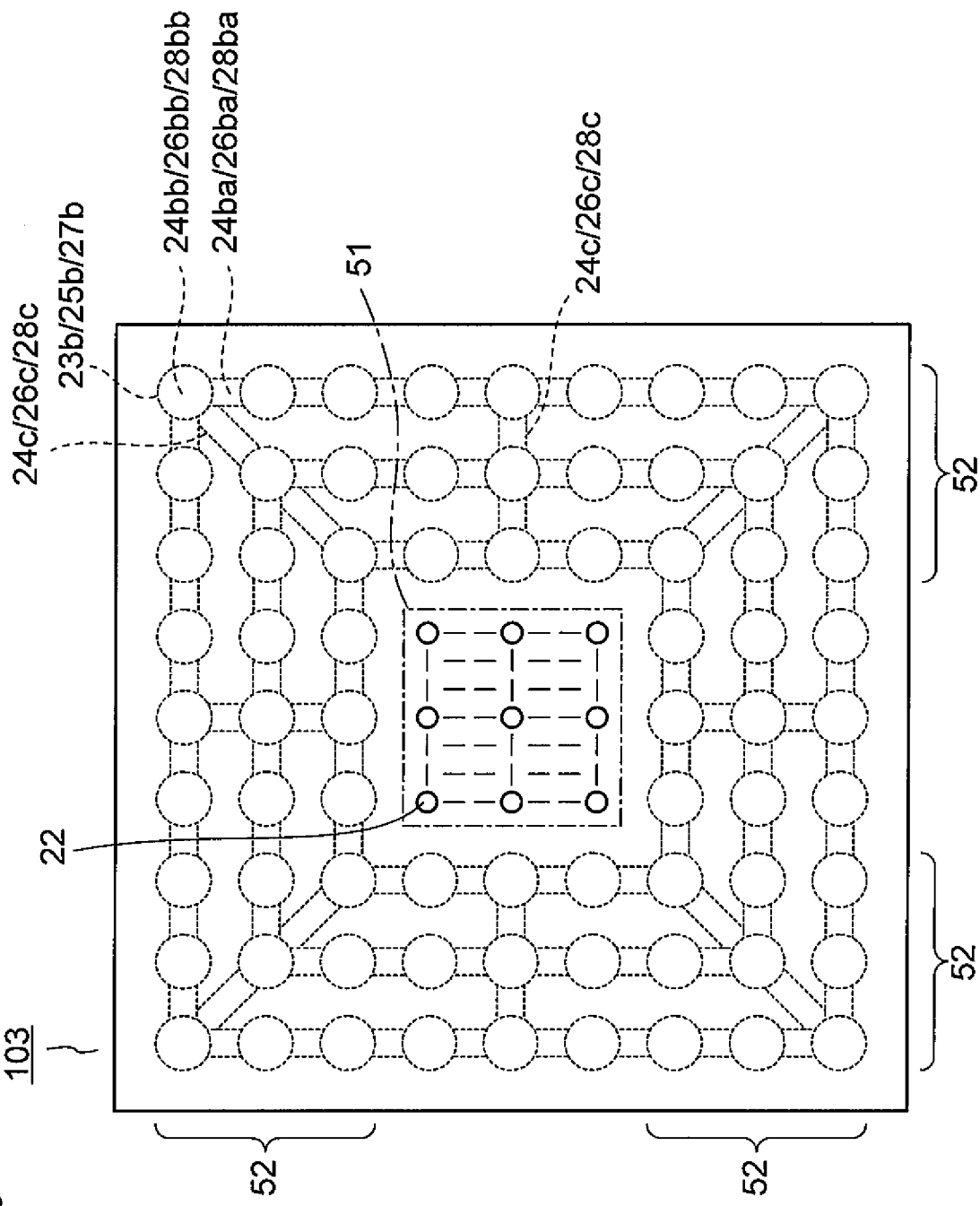
FIG. 8 is a top view showing the constitution of the wiring substrate according to the second embodiment of the present invention.

FIG. 8 is the top view showing the wiring substrate 103 of the second embodiment.

In the wiring substrate 103 of FIG. 8, what is different from the wiring substrate 102 of FIG. 6, is that the first to third reinforcing patterns 24*ba*, 26*ba*, 28*ba* are arranged so as to form a grating in each layer in FIG. 6 whereas the first to third reinforcing patterns 24*ba*, 26*ba*, 28*ba* continuously extending along sides in each layer are arranged by three rows so as to be parallel with each other in FIG. 8. In FIG. 8, items shown by the same reference numerals as ones of FIG. 6 indicate the same items as ones of FIG. 6. In this case as well, the first to third reinforcing patterns 24*ba*, 26*ba*, 28*ba* are formed on the same layer as the second to fourth wiring layers 24*aa*, 26*aa*, 28*aa*, respectively, in the wiring forming region 51, and have a three-layer structure, and are formed by the same material, the same thickness and the same width as the second to fourth wiring layers 24*aa*, 26*aa*, 28*aa*, respectively. Further, the first to third reinforcing pillars 24*bb*, 26*bb*, 28*bb* are formed by the same material as the first to third vias 24*ab*, 26*ab*, 28*ab*, respectively, in the wiring forming region 51, by the same arrangement as FIG. 6, and in three layers.

Now, in FIG. 8, the first to third reinforcing patterns 24*ba*, 26*ba*, 28*ba* arranged in three rows along sides of each layer are connected to each other by the auxiliary first to third reinforcing patterns 24*c*, 26*c*, 28*c* at four corners of the wiring substrate 103 and the central portion of the outer periphery region 52 along each side. The auxiliary first to third reinforcing patterns 24*c*, 26*c*, 28*c* are useful in improving the rigidity of the reinforcing structural body.

Also by the wiring substrate 103 of the second embodiment, since the first to third reinforcing patterns 24*ba*, 26*ba*, 28*ba* are provided so as to continuously extend along each side of the wiring substrate 103, rigidity against the warp that occurs along each side can be enhanced to reduce the warp. Further, by providing the first to third reinforcing patterns 24*ba*, 26*ba*, 28*ba* in three layers, its effect can be further enhanced.

Further, because rigidity further increases by providing a plurality of first to third reinforcing pillars 24*bb*, 26*bb*, 28*bb* at key positions in addition to the first to third reinforcing patterns 24*ba*, 26*ba*, 28*ba*, the warp can be further reduced.

Although the present invention has been described above in detail, the scope of the invention is not limited to the examples specifically shown in the above-described embodiments, and changes of the above-described embodiments within a scope without departing from the gist of the invention are included in the scope of the invention.

For example, in the wiring substrate 102 of FIG. 5, reinforcing patterns are not formed on the same layer as the first wiring layer 22 in the outer periphery region 52, but the patterns may be formed in the outer periphery region 52.

Further, as shown in FIG. 6, in the outer periphery region 52, the first to third reinforcing patterns 24*ba*, 26*ba*, 28*ba*, which continuously extend along each side of the square wiring substrate 102, are provided by three rows so as to be parallel with each other, and other continuously extending first to third reinforcing patterns 24*ba*, 26*ba*, 28*ba* orthogonal to the patterns extending along each side are provided to form a grating, but the invention is not limited to this. Patterns may be provided by two rows to form a grating, or may be provided by four rows or more to form a grating.

Further, as shown in FIG. 8, the first to third reinforcing patterns 24*ba*, 26*ba*, 28*ba*, which continuously extend along each side of the square wiring substrate 102 by three rows so as to be parallel with each other, are provided in the outer periphery region 52, but patterns may be provided by two rows in the same manner or may be provided by four rows or more in the same manner.

Further, the first to third reinforcing pillars 24*bb*, 26*bb*, 28*bb* are provided outside the first reinforcing pattern 24*ba* and between adjacent layers of the first to third reinforcing patterns 24*ba*, 26*ba*, 28*ba*, but reinforcing pillars may be provided between reinforcing patterns arranged one layer or more apart.

Further, nine reinforcing pillars 24*bb*, 26*bb*, 28*bb* are provided per one row of the reinforcing patterns 24*ba*, 26*ba*, 28*ba*, respectively, but it can be changed to various numbers.

Further, although the reinforcing patterns 24*ba*, 26*ba*, 28*ba* and the reinforcing pillars 24*bb*, 26*bb*, 28*bb* are formed at positions overlapped between upper and lower layers in the same shape, the invention is not limited to this. Generally, wiring density is high on the mounting surface of an electronic component side because wirings are intensively laid around an electronic component mounting section, and wiring density is low on the mounting surface of external device side because wirings are widely distributed on the wiring substrate plane thereon. Therefore, in response to the density, various modification examples can be applied such that the density of the reinforcing patterns 24*ba*, 26*ba*, 28*ba* is set to high on the mounting surface of electronic component side, and the density is set to low on the mounting surface of external device side.

Further, the wiring forming region 51 and the outer periphery region 52 on which reinforcing patterns or the like are formed are similarly defined over all layers, but the invention is not limited to this. As described above, because wiring density on the mounting surface of electronic component side is different from that on the mounting surface of external device side, there are cases where areas capable of forming the reinforcing patterns 24*ba*, 26*ba*, 28*ba* become different between layers. In such a case, it is impossible to similarly define the wiring forming region 51 and the outer periphery region 52 uniformly from the upper layer to the lower layer. Therefore, the wiring forming region 51 and the outer periphery region 52 may be defined separately by each layer. Further, a region to form reinforcing patterns or the like may be defined in an arbitrary area other than the wiring forming region 51. These arrangements exert an effect that a space of the wiring substrate can be saved.

Further, the present invention is applied to the coreless wiring substrate in the embodiments, but the invention is not limited to this. The invention can be also applied to a wiring substrate where build-up wiring layers are formed on a core substrate.

Further, as shown in FIG. 4D to FIG. 4F, the second to fourth wiring layers, the first to third vias 24*ab*, 26*ab*, 28*ab*, the first to third reinforcing patterns 24*ba*, 26*ba*, 28*ba* and the first to third reinforcing pillars 24*bb*, 26*bb*, 28*bb* are fabricated at once by using the same material, respectively. But via holes and opening portions may be buried with vias and reinforcing pillars first, followed by forming the wiring layers and the reinforcing patterns by using the same material as or a different material from the vias and the reinforcing pillars in another process.

Further, although the first to third reinforcing patterns 24*ba*, 26*ba*, 28*ba* and the first to third reinforcing pillars 24*bb*, 26*bb*, 28*bb* are formed by the same process as the fabricating process of the second to fourth wiring layers 24*aa*, 26*aa*, 28*aa* and the first to third vias 24*ab*, 26*ab*, 28*ab*, respectively, they may be fabricated by a different process from the fabricating process of the second to fourth wiring layers 24*aa*, 26*aa*, 28*aa* and the first to third vias 24*ab*, 26*ab*, 28*ab*, respectively.

Further, although the material, thickness and width of the first to third reinforcing patterns 24*ba*, 26*ba*, 28*ba* are the same as the material, thickness and width of the second to fourth wiring layers 24*aa*, 26*aa*, 28*aa*, respectively, the material, thickness and width of the first to third reinforcing patterns 24*ba*, 26*ba*, 28*ba* can be variously changed within a scope to achieve the object of the present invention. The same applies to the material of the first to third reinforcing pillars 24*bb*, 26*bb*, 28*bb*.

As described above, according to the present invention, because the occurrence of warp resulted from a thermal expansion coefficient difference can be reduced, a chip or the like is prevented from cracking during chip mounting, and reliability of chip mounting can be further improved.

What is claimed is:

1. A wiring substrate, comprising:
   (i) a wiring forming region in which wiring layers and insulating layers are alternately stacked;
   (ii) an outer periphery region around the wiring forming region; and
   (iii) a solid reinforcing structural body having
       (a) a first reinforcing member continuously extending along said outer periphery region, and
       (b) a second reinforcing member extending in a thickness direction and being engaged with the first reinforcing member, wherein
   said first reinforcing member is composed of reinforcing patterns having a multilayer structure and continuously extending within planes of respective insulating layers, and being formed along each side of said wiring substrate, said second reinforcing member is composed of reinforcing pillars buried in said insulating layer sandwiched between said reinforcing patterns of different layers, said reinforcing patterns and said reinforcing pillars are bonded together to form the solid reinforcing structural body and formed so as to surround said wiring forming region,
   one surface of said wiring substrate is a mounting surface of an electronic component,
   another surface of said wiring substrate is a mounting surface of an external device, and
   the first reinforcing member and the second reinforcing member are electrically separated from the wiring layers in the wiring forming region.

2. The wiring substrate according to claim 1, wherein in said wiring forming region, said wiring layers of adjacent wiring layers are connected by a via buried in said insulating layer between said adjacent wiring layers, and in said outer periphery region, said reinforcing patterns are formed on the same layers as some of said wiring layers and by the same material and the same thickness as said wiring layers, and said reinforcing pillars are formed by the same material as said via.

3. The wiring substrate according to claim 1, wherein within the same said layer, a plurality of said reinforcing patterns are arranged so as to be parallel with each other.

4. A wiring substrate comprising:
   (i) a wiring forming region in which wiring layers and insulating layers are alternately stacked;
   (ii) an outer periphery region around the wiring forming region; and
   (iii) a reinforcing structural body having
       (a) a first reinforcing member continuously extending along said outer periphery region, and
       (b) a second reinforcing member extending in a thickness direction and being engaged with the first reinforcing member,
   wherein said first reinforcing member is composed of reinforcing patterns having a multilayer structure and continuously extending within planes of respective insulating layers, and being formed along each side of said wiring substrate, said second reinforcing member is composed of reinforcing pillars buried in said insulating layer sandwiched between said reinforcing patterns of different layers, said reinforcing patterns and said reinforcing pillars are formed so as to surround said wiring forming region, and one surface of said wiring substrate is a mounting surface of an electronic component and another surface of said wiring substrate is a mounting surface of an external device wherein within the same said layer, a plurality of said reinforcing patterns is arranged so as to form a grating.

5. An electronic component device, comprising:

a wiring substrate having:

(i) a wiring forming region in which wiring layers and insulating layers are alternately stacked;

(ii) an outer periphery region around the wiring forming region; and (iii) a reinforcing structural body having (a) a first reinforcing member continuously extending along said outer periphery region, and (b) a second reinforcing member extending in a thickness direction and being engaged with the first reinforcing member, wherein said first reinforcing member is composed of reinforcing patterns having a multilayer structure and continuously extending within planes of respective insulating layers, and being formed along each side of said wiring substrate, said second reinforcing member is composed of reinforcing pillars buried in said insulating layer sandwiched between said reinforcing patterns of different layers, said reinforcing patterns and said reinforcing pillars are formed so as to surround said wiring forming region, and one surface of said wiring substrate is a mounting surface of an electronic component and another surface of said wiring substrate is a mounting surface of an external device; and electronic components connected to the outermost wiring layer of said wiring substrate.

6. The electronic component device according to claim 5, wherein thermosetting resin is filled in a gap between said wiring substrate and said electronic components.

\* \* \* \* \*